(12) United States Patent
Haraki

(10) Patent No.: US 8,660,731 B2
(45) Date of Patent: Feb. 25, 2014

(54) IN-VEHICLE CHARGING SYSTEM

(75) Inventor: Toshihisa Haraki, Shizuoka-ken (JP)

(73) Assignee: Suzuki Motor Corporation, Shizuoka-ken (JP)

( * ) Notice: Subject to any disclaimer, the term of this patent is extended or adjusted under 35 U.S.C. 154(b) by 0 days.

(21) Appl. No.: 13/461,060

(22) Filed: May 1, 2012

(65) Prior Publication Data

US 2012/0296504 A1  Nov. 22, 2012

(30) Foreign Application Priority Data

May 19, 2011  (JP) .................................. 2011-112485

(51) Int. Cl.
*B60L 9/00* (2006.01)
(52) U.S. Cl.
USPC ............................ 701/22; 180/65.29; 903/903
(58) Field of Classification Search
USPC .................. 701/22; 320/109, 132; 180/65.29; 903/903
See application file for complete search history.

(56) References Cited

U.S. PATENT DOCUMENTS

| | | | |
|---|---|---|---|
| 6,794,853 B2 * | 9/2004 | Kondo | 320/132 |
| 7,459,884 B2 * | 12/2008 | Sasaki et al. | 320/132 |
| 7,999,665 B2 * | 8/2011 | Chander et al. | 340/455 |
| 2010/0057281 A1 * | 3/2010 | Lawyer et al. | 701/22 |
| 2011/0037582 A1 * | 2/2011 | Wu | 340/438 |
| 2011/0169448 A1 * | 7/2011 | Ichikawa | 320/109 |
| 2012/0109443 A1 * | 5/2012 | Takahashi et al. | 701/22 |
| 2012/0256587 A1 * | 10/2012 | Soong et al. | 320/109 |
| 2012/0290235 A1 * | 11/2012 | Schaefer et al. | 702/63 |

FOREIGN PATENT DOCUMENTS

| | | |
|---|---|---|
| JP | 2010-158133 | 7/2010 |
| JP | WO2011/155128 A1 * | 5/2011 |

\* cited by examiner

*Primary Examiner* — Helal A Algahaim
*Assistant Examiner* — Shardul Patel
(74) *Attorney, Agent, or Firm* — Alston & Bird LLP

(57) ABSTRACT

In an in-vehicle charging system, a charging display function is improved while versatility of the system is ensured, and usability is improved by enhancing charging display content. An EV controller (4) calculates a charge amount and outputs the calculated charge amount and a state of charge of a battery (2) to a communication line (9). A meter device (6) calculates a time required for completing charging of a battery based on the charge amount and the state of charge of the battery received via the communication line (9), and then calculates an end time based on the required time to display the end time on a display (5) while controlling colored lighting that indicates a remaining required time in accordance with the set time determined in advance.

2 Claims, 3 Drawing Sheets

IN-VEHICLE CHARGING SYSTEM

CROSS-REFERENCE TO RELATED APPLICATIONS

The present application claims priority to Japanese Patent Application No. 2011-112485, filed May 19, 2011, which is incorporated herein in its entirety.

BACKGROUND OF THE INVENTION

1. Field of the Invention

The present invention relates to an in-vehicle charging system. More particularly, the present invention relates to an in-vehicle charging system which is connected to an external power supply to charge a battery in a vehicle such as an electric vehicle (EV) and a hybrid electric vehicle (PHEV) and which displays a charging condition by being connected to a controller via a communication line (LAN, CAN, or the like) mounted in the vehicle.

2. Description of Related Art

A vehicle such as an electric vehicle (EV) and a hybrid electric vehicle (PHEV) is generally provided with a display or charger that displays an end time for recognizing a charge completion time.

The charger may include a display for displaying an estimated time required for completing charging of a battery. The estimated time is displayed with a light that changes color.

Such a charger is exclusively designed to detect a state in the process of charging the battery based on a passing current or the like and to display it.

The charger mounted in the vehicle converts AC power supplied from the outside to DC power of high voltage by AC/DC conversion and supplies it to a high voltage battery. At this time, an EV controller, which is an internal controller stored in the high voltage battery, mainly controls a charging condition of the high voltage battery.

The EV controller also performs total control by communicating with a plurality of internal controllers and obtaining information relating to voltage, current, temperature, and the like.

A charge completion guiding system for an electric vehicle disclosed in Japanese Patent Laid-Open No. 2010-158133 includes a device which calculates a time required for charging and a portable device having an acquirer that acquires charge completion information and a notifier that notifies the charge completion information.

The system disclosed in Japanese Patent Laid-Open No. 2010-158133, however, is required to be exclusively designed for communicating the time required for charging, which is required to be improved.

Also, a place for mounting the charger in the vehicle as described above is limited depending on various conditions. Thus, the display is generally required to be provided separately.

Since the vehicle includes a meter grouping that groups various displays (meters, indicators, or the like), display can be performed by using the meter grouping. The display can be provided in a meter for displaying information relating to charging with multi-displays (liquid-crystal both sides) stored in the meter.

However, even when information to be displayed is decided (i.e., a time required for completing charging of a battery), a general charger integrated with a display is not adapted to implement a communication process.

Even when the display is separately provided, processing content and communication data for every device are not particularly decided until final display is performed. Accordingly, they are required to be set and facilitated.

When the EV controller has a structure for calculating a charging end time based on charging content, remaining battery level, or the like, a meter for displaying it by communicating with the EV controller is required to be capable of data communication of the charging end time separately from the data such as the remaining battery level. Thus, a system relating to such communication becomes complicated and its versatility is reduced.

When different battery capacities are provided in the same vehicle, individual components cannot be commonly used in the case in which the components are exclusively designed for each model. Thus, mass production effect is unfavorably reduced.

SUMMARY OF THE INVENTION

An object of the present invention is to provide an in-vehicle charging system which improves a charging display function while ensuring system versatility and which improves usability by enhancing charging display content.

An in-vehicle charging system according to an aspect of the present invention includes: an EV controller connected to a battery and a charger which are mounted in a vehicle; a meter device which has a display having a function of colored lighting and providing segment display; a vehicle body controller which includes a notifier; and a communication line mounted in the vehicle to be connected to the EV controller, the meter device, and the vehicle body controller, in which the EV controller calculates a charge amount and outputs the calculated charge amount and a state of charge of the battery to the communication line, and the meter device calculates a time required for completing charging of the battery based on the charge amount and the state of charge of the battery received via the communication line and calculates an end time based on the required time to display the end time on the display while controlling the colored lighting that indicates a remaining required time in accordance with the set time determined in advance.

In the in-vehicle charging system according to the present invention, a charging display function can be improved while versatility of the system can be ensured, and usability can be also improved by enhancing charging display content.

Figure 1:
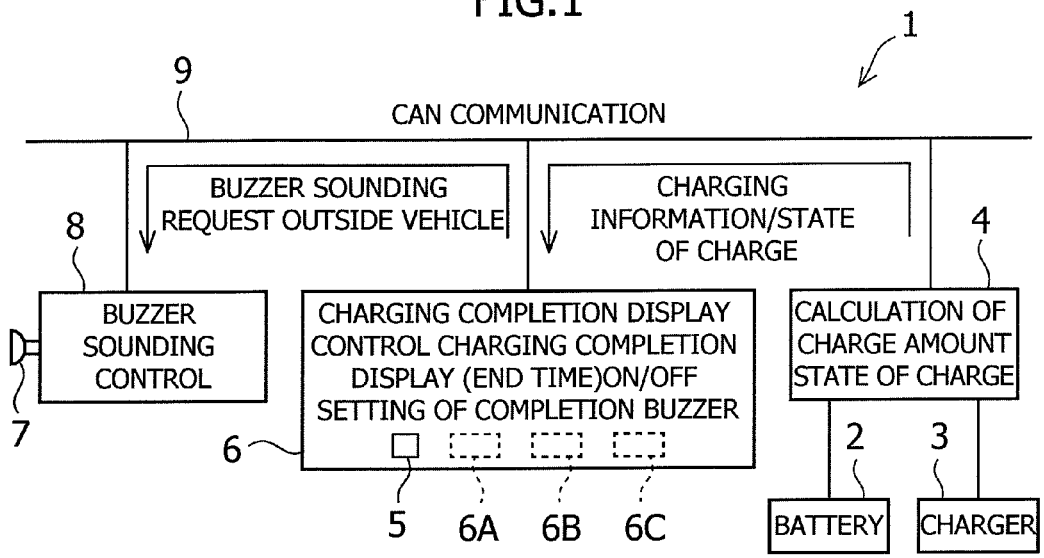
FIG. 1 is a block diagram showing an in-vehicle charging system according to an embodiment.

REFERENCE SIGNS LIST 1 in-vehicle charging system
2 battery
3 charger
4 EV controller
5 display
6 meter device
7 notifier 8 vehicle body controller
9 communication line
10 meter panel
11 meter
12 knob

DETAILED DESCRIPTION OF PREFERRED EMBODIMENTS

An object of the present invention, which improves a charging display function while ensuring system versatility and which improves usability by enhancing charging display content, is achieved by outputting a calculated charge amount and a state of charge of a battery to a communication line, calculating a time required for completing charging of a battery based on the charge amount and the state of charge of the battery received via the communication line, calculating an end time based on the required time to display the end time on a display while controlling colored lighting that indicates a remaining required time in accordance with the set time determined in advance.

FIGS. 1 to 5 show the embodiment of the present invention.

In FIG. 1, the reference numeral 1 denotes an in-vehicle charging system which is connected to an external power supply to charge a battery in a vehicle such as an electric vehicle (EV) and a hybrid electric vehicle (PHEV).

The in-vehicle charging system 1 includes an EV controller 4 connected to a battery 2 and a controller of a charger 3 mounted in the vehicle, a meter device 6 having a display 5 which has a function of producing colored light and with which a segment display is possible, a vehicle body controller (BCM) 8 having a notifier (buzzer, chime, or the like) 7, and a communication line 9 mounted in the vehicle to be connected to the EV controller 4, the meter device 6, and the vehicle body controller 8.

The EV controller 4, the meter device 6, and the vehicle body controller 8 are automatically started during charging.

The charger 3 has a charging cable connected to a charging port of the vehicle. When power is input from the external power supply, relays are switched to start charging the battery 2.

Figure 5:
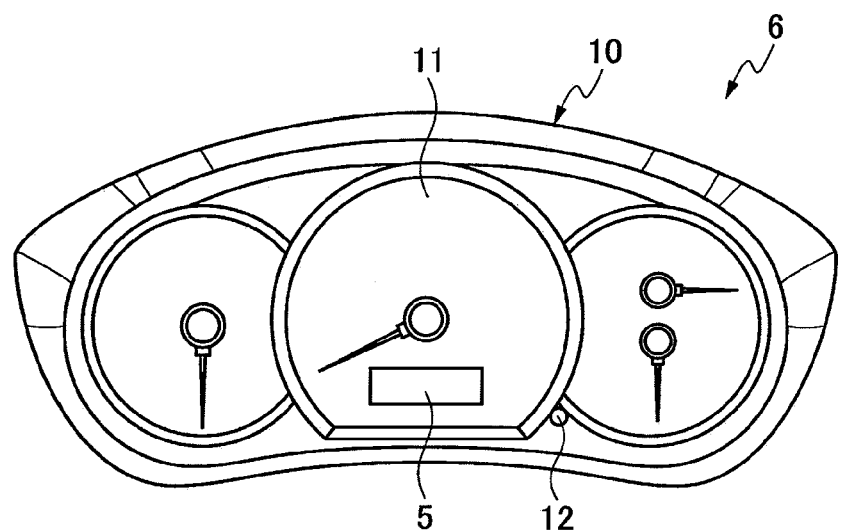
FIG. 5 is a block diagram showing a meter device according to the embodiment.

As shown in FIG. 5, the meter device 6 includes a meter 11 provided in a meter grouping 10, and the display 5 provided in the meter 11.

The vehicle body controller 8 controls the notifier 7 to operate, for example, to sound, when receiving a notification request signal from the communication line 9.

The EV controller 4 calculates a charge amount in charging the battery, and outputs the calculated charge amount and a state of charge (SOC) of the battery 2 to the communication line 9. While the charging cable is connected to the charging port of the vehicle for charging, the EV controller 4 calculates the charge amount and outputs it to the meter device 6 via the communication line 9.

The meter device 6 calculates a time required for completing charging of the battery (charging time) based on the charge amount and the state of charge of the battery received via the communication line 9, and then calculates an end time based on the required time to display the end time on the display 5 while controlling the colored light that indicates a remaining required time in accordance with the set time determined in advance. Thus, the meter device 6 includes a timer 6A.

With such a structure, an indication of charging completion can be provided with an enhanced charging display function while ensuring versatility of the system.

Since the charging display content is enhanced by time and the visibility is enhanced by color, the usability can be improved.

Since newly required functions are grouped in the meter device 6 and existing functions of the devices such as the EV controller 4 already mounted in the vehicle are utilized, the versatility of the system can be ensured.

The meter device 6 further includes a function of setting whether acoustic notification is possible or not. When the acoustic notification is possible, the meter device 6 outputs a notification request signal to the vehicle body controller 8 via the communication line 9.

By acoustically notifying to provide an indication of charging completion, the charging display function can be improved.

Since the necessary functions are grouped in the meter device 6 and the notifier 7 already mounted in the vehicle is used, the versatility of the system can be ensured.

In addition to the charge amount and the state of charge of the battery, the EV controller 4 outputs model information (a parameter corresponding to a fully charged battery capacity) to the communication line 9.

The meter device 6 also stores in advance a plurality of charging characteristics maps which are different depending on the type of the battery 2, and selects one of the charging characteristics maps in accordance with the model information received from the EV controller 4. Then, the meter device 6 calculates the required time based on the charging characteristics map. Accordingly, the meter device 6 includes a map storing part 6B storing the plurality of charging characteristics maps.

Even when the newly required functions are grouped in the meter device 6 and the existing functions are set to have different specification, since the common communication data is used and the existing functions of the devices such as the EV controller 4 already mounted in the vehicle are used, the versatility of the system can be ensured.

The meter device 6 includes a knob 12 which is operated by a user in the meter grouping 10 as shown in FIG. 5, and a program controller 6C for a control program which switches the notifications in accordance with the setting selected by the knob 12 as shown in FIG. 1.

Figure 4:
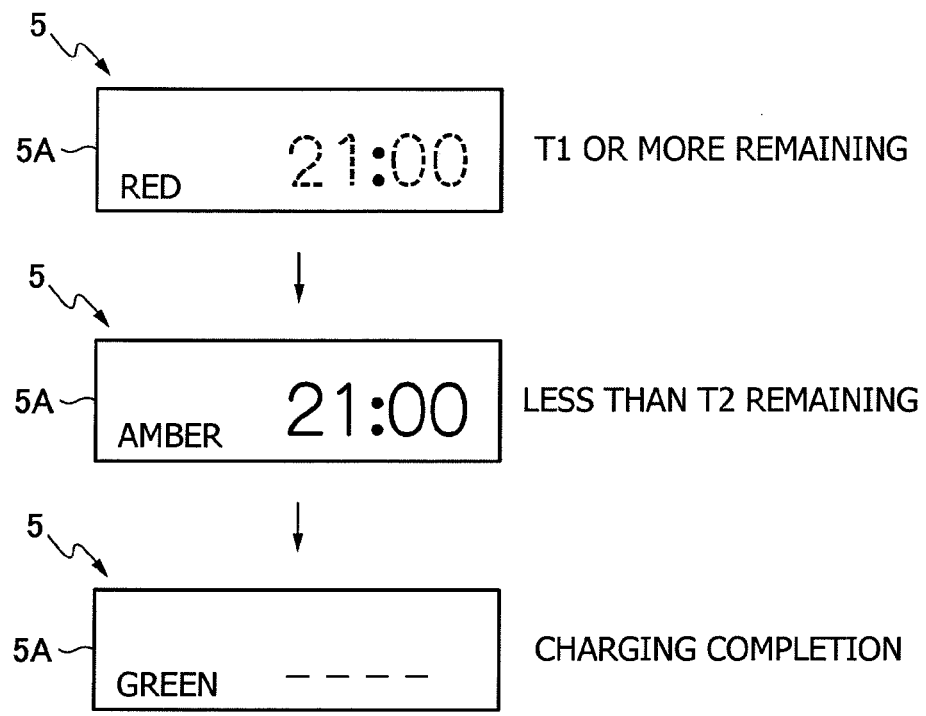
FIG. 4 illustrates display of a charging condition according to the embodiment.

By using the knob 12, the user can customize the setting for switching ON/OFF the notifier 7 when the charging is completed, and the setting of a lighting color changing time (for example, remaining time of a first set time T1 (60 min) and a second set time T2 (30 min)) at the display 5 in accordance with a remaining time. More specifically, as shown in FIG. 4, when the first set time T1 or more remains, a backlight 5A on the display 5 lights up in red to display an end time (indicated by dotted numbers in FIG. 4). On the other hand, when less than the second set time T2 (30 min) remains, the backlight 5A on the display 5 lights up in amber to display the end time (indicated by solid numbers in FIG. 4). When the charging is completed, the backlight 5A on the display 5 lights up in green to display " - - - ".

The meter device 6 can change the setting relating to whether the notification is possible or not by the operation of the knob 12, and a set time for switching colors in the lighting color control. During charging of the battery, the end time displayed on the display 5 is illuminated with the backlight in warm colors (i.e., red, amber, yellow, or the like) which are switched depending on the remaining required time. On the other hand, a time display is terminated in non-warm colors (i.e., blue, green, or the like) when the charging is completed. Incidentally, the non-warm colors include white.

The meter device 6 is in a setting mode when performing predetermined operations on each operation part of the vehicle in predetermined sequence. When the meter device 6 is in the setting mode, the switching and selecting operations are possible by rotating and pushing the knob 12 of the meter device 6.

The user can set a time by performing input operation in accordance with processing steps.

Accordingly, the settings can be changed depending on the user and the visibility can be enhanced, and therefore the usability can be improved.

Next, the charging display control according to the embodiment will be explained below with reference to a flow chart in FIG. 2.

Figure 2:
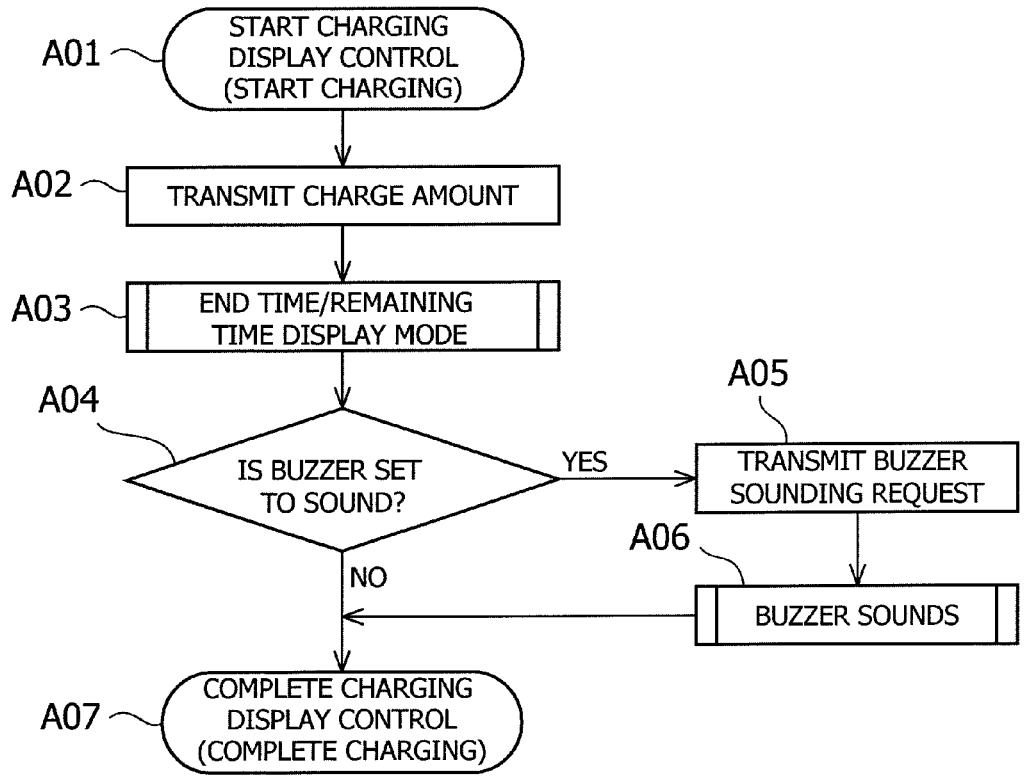
FIG. 2 is a flow chart showing charging display control according to the embodiment.

As shown in FIG. 2, when charging is started (step A01), the EV controller 4 transmits a calculated charge amount to the meter device 6 via the communication line 9 (step A02) and then the meter device 6 is in an end time/remaining time display mode (step A03). The end time/remaining time display mode will be explained later.

Subsequently, the meter device 6 determines whether the notifier 7 is set to sound (step A04).

When it is determined that the notifier 7 is set to sound at the step A04, the meter device 6 transmits a buzzer blow request signal to the vehicle body controller 8 (step A05). Then, the vehicle body controller 8 produces acoustic sound with the notifier 7 (step A06).

When it is determined that the notifier 7 is not set to sound at the step A04, or after the processing at the step A06 is terminated, the charging is completed (step A07).

Figure 3:
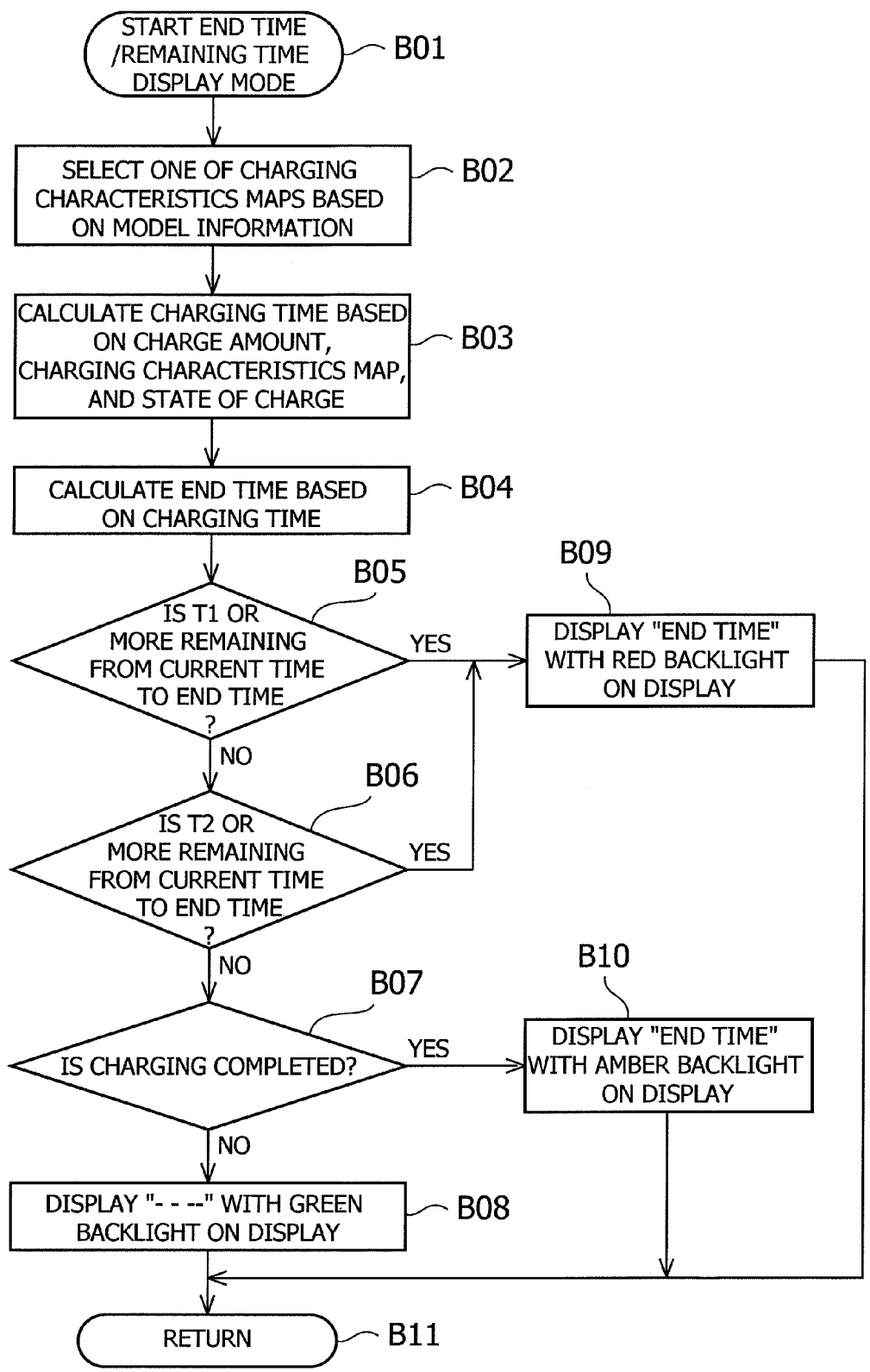
FIG. 3 is a flow chart showing an end time/remaining time display mode according to the embodiment.

The end time/remaining time display mode in the meter device 6 at the step A03 is processed as shown in FIG. 3.

As shown in FIG. 3, the end time/remaining time display mode is started (step B01), one of the charging characteristics maps is selected based on the model information (step B02) and then the charging time is calculated based on the charge amount, the charging characteristics map, and the state of charge of the battery (step B03).

Then, the charging end time is calculated based on the calculated charging time (step B04), and whether the first set time T1 (60 min) or more remains from a current time to the charging end time is determined (step B05). Incidentally, the first set time T1 can be set freely by the user.

When it is determined that the first set time T1 or more does not remain at the step B05, the first set time T1 (60 min) and the second set time T2 (30 min) are compared with each other from the current time to the charging end time to determine whether T1 is T2 or more (step B06). Incidentally, the second set time T2 can be set by the user.

When it is determined that T1 is not T2 or more at the step B06, it is determined whether the charging is completed or not (step B07). When it is determined that the charging is not completed, the backlight 5A on the display 5 lights up in green to display " - - - " (step B08).

On the other hand, when the it is determined that the first set time T1 or more remains at the step B05, or when it is determined that T1 is T2 or more at the step B06, the backlight 5A on the display 5 lights up in red to display "end time" (step B09). In other words, a time remaining from the current time to the end time is less than the first set time T1 and the second set time T2 or more, the previous lighting and display are maintained.

On the other hand, when it is determined that the charging is completed at the step B07, the backlight 5A on the display 5 lights up in amber to display "end time" (step B10).

After the processing at the step B08, the processing at the step B09, or the processing at the step B10, the program returns (step B11).

As described above, in this embodiment, the meter device 6 calculates a charging completion time based on the charging content information, the model information (for switching charging characteristics maps), and the state of charge of the battery from the EV controller 4. Then, the meter device 6 displays an estimated end time on the display 5 using a clock function in the meter device 6 based on a remaining charging time, and changes a lighting color of the display 5 in accordance with the time remaining until the estimated end time. When the charging is completed, the notifier 7 outside the vehicle sounds. Using the knob 12 and the display 5 in the meter device 6 allows for the setting relating to present or absence of the buzzer function outside the vehicle and the setting of the lighting color relative to the time remaining until the end time (how many minutes are left in changing the lighting color).

Thus, the estimated end time can be displayed even in charging at home. By indicating the time remaining until the estimated end time with the colored light at the display 5, the remaining time can be easily confirmed without riding in the vehicle. Furthermore, by sounding the notifier 7 outside the vehicle when the charging is completed, the user can be notified that the charging is completed even when remaining away from the vehicle. Furthermore, the function of calculating the remaining time and a sounding request function of the notifier 7 are grouped in the meter device 6, and devices other than the meter device 6 are minimally changed from the conventional system. Accordingly, the new functions can be added only by changing the meter device 6, and therefore it is not required to add new components.

The in-vehicle charging system according to the present invention is applicable to various electric vehicles.

What is claimed is:

1. An in-vehicle charging system comprising:
an EV controller connected to a battery and a charger which are mounted in a vehicle;
a meter device which includes a display having a function of colored lighting and providing segment display;
a vehicle body controller which includes a notifier; and
a communication line mounted in the vehicle to be connected to the EV controller, the meter device, and the vehicle body controller,
wherein the EV controller calculates a charge amount and outputs the calculated charge amount and a state of charge of the battery to the communication line;
wherein the meter device calculates a time required for completing charging of the battery based on the charge amount and the state of charge of the battery received via the communication line and calculates an end time based on the required time to display the end time on the display while controlling the colored lighting that indicates a remaining required time in accordance with the set time determined in advance;
wherein the meter device has a function of setting whether acoustic notification is possible or not so as to output a notification request signal to the vehicle body controller via the communication line when it is set that the acoustic notification is possible; and
wherein the meter device includes a knob operated by a user to change setting relating to whether the notification is possible or not and a set time for switching colors in the lighting color control by operation of the knob, the meter device illuminating the end time displayed on the display with a backlight in warm colors which are switched depending on the set time when the battery is charged and completing a time display in non-warm colors when the charging is completed.

2. The in-vehicle charging system according to claim 1, wherein
the EV controller outputs model information to the communication line in addition to the charge amount and the state of charge of the battery, and
the meter device stores in advance a plurality of charging characteristics maps which are different depending on a type of the battery, selects one of the charging characteristics maps in accordance with the model information received from the EV controller, and calculates the required time based on the charging characteristics map.

* * * * *